US008368134B2

(12) United States Patent
Chang et al.

(10) Patent No.: US 8,368,134 B2
(45) Date of Patent: Feb. 5, 2013

(54) NONVOLATILE MEMORY DEVICE AND METHOD FOR FABRICATING THE SAME

(75) Inventors: Ming-Cheng Chang, Taipei County (TW); Chih-Hsiung Hung, Taipei County (TW); Mao-Ying Wang, Taipei County (TW); Wei-Hui Hsu, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 438 days.

(21) Appl. No.: 12/767,639

(22) Filed: Apr. 26, 2010

(65) Prior Publication Data

US 2010/0200903 A1 Aug. 12, 2010

Related U.S. Application Data

(62) Division of application No. 12/016,100, filed on Jan. 17, 2008, now Pat. No. 7,754,614.

(30) Foreign Application Priority Data

Sep. 3, 2007 (TW) .............................. 96132709 A

(51) Int. Cl.
*H01L 27/108* (2006.01)
*H01L 29/76* (2006.01)
*H01L 29/94* (2006.01)
*H01L 31/119* (2006.01)

(52) U.S. Cl. ... 257/296; 257/301; 257/310; 257/E21.17; 257/E21.32; 257/E21.229; 257/E21.278; 257/E21.293; 257/E21.304; 257/E21.645; 257/E21.646

(58) Field of Classification Search .................. 257/296, 257/301, 315, 316, 318, 320, 310, 760, E21.17, 257/E21.32, E21.229, E21.304, E21.645, 257/E21.646
See application file for complete search history.

(56) References Cited

U.S. PATENT DOCUMENTS 6,998,313 B2 * 2/2006 Lin ............................... 438/270
7,754,614 B2 * 7/2010 Chang et al. .................. 438/700

* cited by examiner

*Primary Examiner* — David Nhu

(57) ABSTRACT

A nonvolatile memory device and method for fabricating the same are provided. The method for fabricating the nonvolatile memory device comprises providing a substrate. A tunnel insulating layer and a first conductive layer are formed in the substrate. A trench is formed through the first conductive layer and the tunnel insulating layer, wherein a portion of the substrate is exposed from the trench. A first insulating layer is formed in the trench. A second insulating layer is formed on sidewalls of the first insulating layer. A third insulating layer is conformably formed in the trench, covering the first insulating layer on a bottom portion of the trench and the second insulating layer on the sidewalls of the trench, wherein thickness of the third insulating layer on the sidewalls is thinner than that on the bottom of the trench. A control gate is formed on the third insulating layer in the trench.

6 Claims, 8 Drawing Sheets

NONVOLATILE MEMORY DEVICE AND METHOD FOR FABRICATING THE SAME

This application is a divisional of U.S. patent application Ser. No. 12/016,100, filed Jan. 17, 2008, now U.S. Pat. No. 7,754,614, the entire disclosure of which is hereby incorporated by reference, which claims the benefit of Taiwan Patent Application No. 96132709, filed on Sep. 3, 2007.

BACKGROUND OF THE INVENTION

1. Field of the Invention

The invention relates to a nonvolatile memory device and method for fabricating the same, and more particularly, relates to a control gate insulating layer of a nonvolatile memory device and method for fabricating the same.

2. Description of the Related Art

A flash memory is a type of non-volatile memory. Generally speaking, a flash memory comprises two gates, the first gate is a floating gate for data storage and the second gate is a control gate for data input/output. The floating gate is placed under the control gate and "floats". Note that "floating", refers to isolating the floating gate and surrounding it with insulating materials for preventing charge loss. The control gate is connected to a word line (WL) for device control. One advantage of flash memories is block-by-block erasing. Flash memories are widely used in consumer electronic products, for example, digital cameras, digital videos, mobile phones, desktops, mobile audio players and personal digital assistants (PDA).

FIG. 1 illustrates a conventional nonvolatile memory device 150. The conventional nonvolatile memory device 150 mainly comprises a common-used control gate 110 and a pair of floating gates having a first floating gate 104a and a second floating gate 104b. Inter-gate insulating layers 106a and 106b are located between the control gate 110 and the first floating gate 104a and the second floating gate 104b, respectively. A control gate insulating layer 108 is located between the control gate 110 and a substrate 100. The conventional control gate insulating layer 108 formed by, for example, thermal oxidation process usually has non-uniform thickness. For example, the central portion of the conventional control gate insulating layer has a thickness larger than a thickness of the marginal region of the control gate insulating layer. When a high voltage is applied to the control gate to program or erase data stored in the floating gate, a malfunction, for example, early breakdown, occurs at the thinner control gate insulating layer region, hindering electrical performances or device reliability.

Thus, a novel nonvolatile memory device with a uniform control gate insulating layer is needed.

BRIEF SUMMARY OF INVENTION

To solve the above-described problem, a nonvolatile memory device and method for fabricating the same are provided. An exemplary embodiment of the present invention for fabricating a nonvolatile memory device comprises providing a substrate and forming a tunnel insulating layer and an overlaying first conductive layer in the substrate in sequence. Next, a trench is formed through the first conductive layer and the tunnel insulating layer, wherein a portion of the substrate is exposed from the trench. A first insulating layer is formed in the trench, along with a second insulating layer on sidewalls of the first insulating layer. The first insulating layer on a bottom portion of the trench is exposed, conformably forming a third insulating layer in the trench, covering the first insulating layer on the bottom of the trench and the second insulating layer on the sidewalls of the trench. Note that thickness of the third insulating layer on the sidewalls of the trench is thinner than that of on the bottom of the trench. Next, a control gate on the third insulating layer in the trench is formed.

An exemplary embodiment of a nonvolatile memory device comprises a substrate and a pair of floating gate structures comprising a tunnel insulating layer and a floating gate disposed on the substrate, facing each other and isolated from each other by a trench. A first insulating layer is conformably disposed on the sidewalls of the trench and the substrate in the trench, and a second insulating layer is conformably disposed on the first insulating layer on the sidewalls of the trench. A third insulating layer comprises a first portion disposed on the second insulating layer on the sidewalls of the trench, and a second portion disposed on the first insulating layer on the substrate, wherein the first portion has a thickness thinner than that of the second portion. A control gate is disposed on the third insulating layer in the trench.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
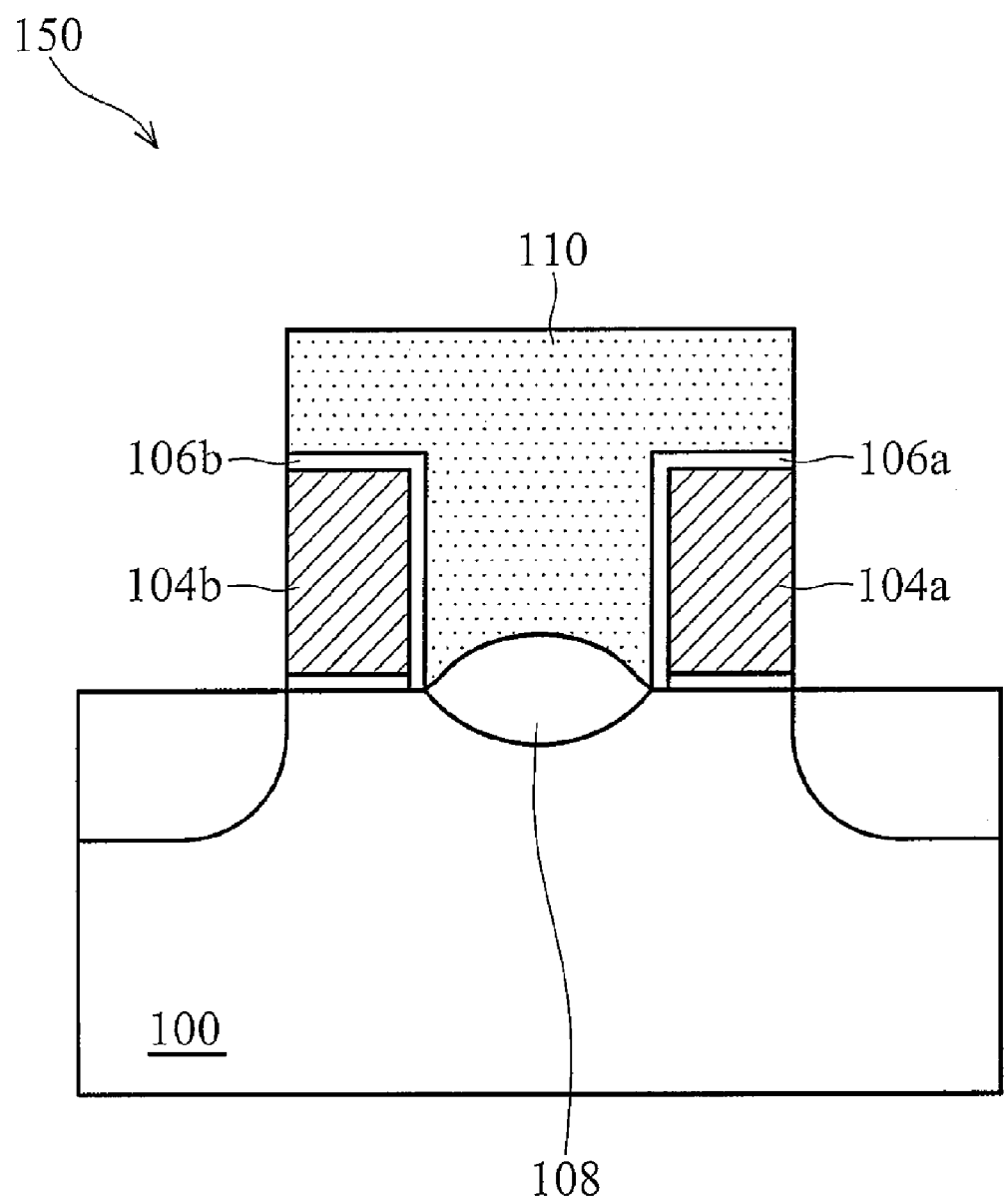
FIG. 1 shows a conventional nonvolatile memory device.

The following description is of a mode of carrying out the invention. This description is made for the purpose of illustrating the general principles of the invention and should not be taken in a limiting sense. The scope of the invention is best determined by reference to the appended claims.

FIGS. 2 to 11 are cross sections of an exemplary embodiment of a nonvolatile memory device of the invention. Wherever possible, the same reference numbers are used in the drawings and the descriptions to refer to the same or like parts.

Figure 2:
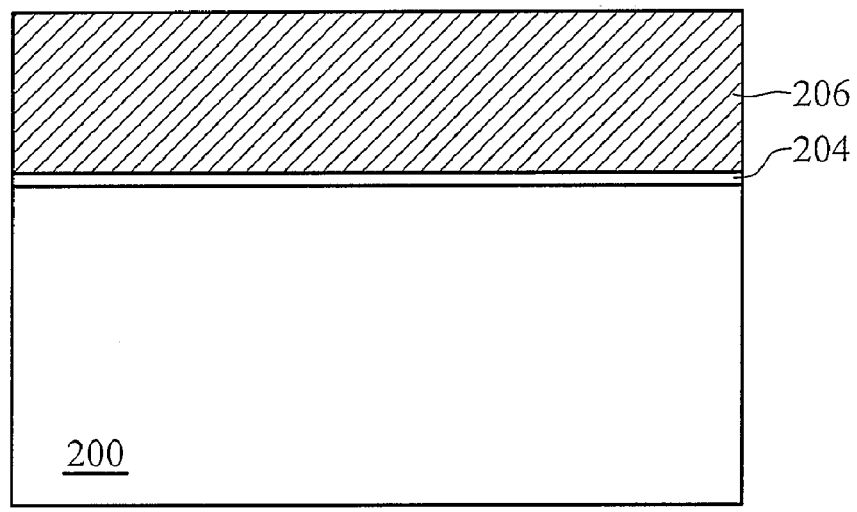
FIGS. 2 to 11 are cross sections of an exemplary method for fabricating a nonvolatile memory device of the invention.
Figure 3:
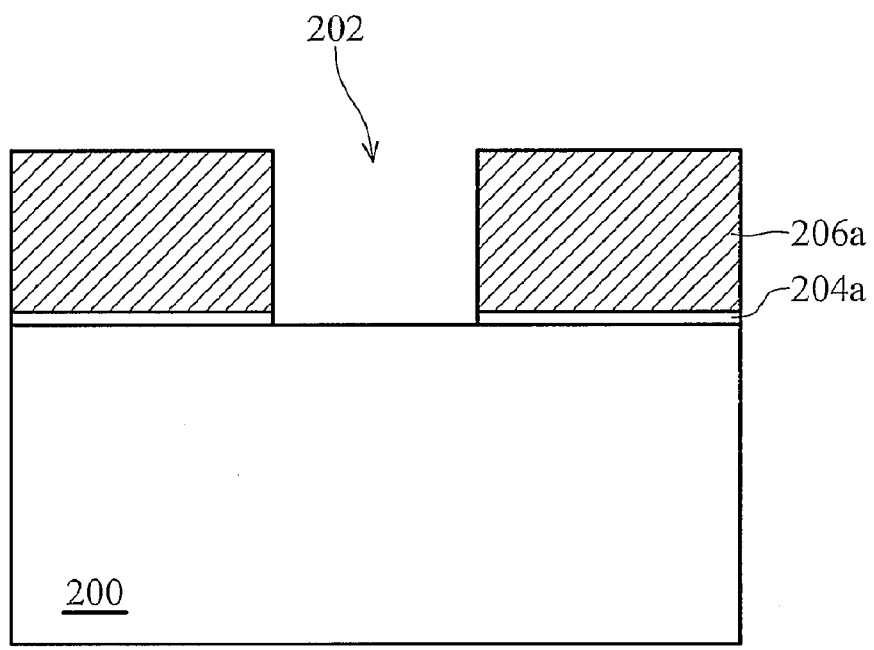

Referring to FIG. 2, a substrate 200 is provided. The substrate 200 is preferably a silicon substrate. Also, the substrate 200 may comprise SiGe silicon on insulator (SOI), and other commonly used semiconductor substrates can be used. In one embodiment, a plurality of shallow trench isolations (STI) (not shown) is formed in the substrate 200 to isolate subsequent semiconductor devices. The shallow trench isolations (STI) may be formed by etching the substrate 200 to form recesses. Next, a dielectric material such as a high-density plasma oxide (HDP oxide) is filled in the recesses. A planarization process such as chemical mechanical polish (CMP) is performed to remove the excessive dielectric material on top of the substrate 200 to form STIs in the substrate 200. Next, a tunnel insulating layer 204 and an overlaying first conductive layer 206 are formed on the substrate 200 in sequence. The tunnel insulating layer 204 may be a silicon dioxide ($SiO_2$) layer formed by thermal oxidation, atmospheric pressure chemical vapor deposition (APCVD) or low pressure CVD (LPCVD) with a thickness of about 70 Å to 100 Å. The first conductive layer 206 may be a polysilicon layer formed by CVD with a thickness of about 1000 Å to 3000 Å.

Next, a trench 202 is formed through the first conductive layer 206 and the tunnel insulating layer 204, and a portion of the substrate 200 is exposed from the trench 202. In one embodiment, the conductive layer 206 is then covered with a patterned photoresist (not shown) to define a position of the trench 202, and anisotropic etching such as dry etching is next performed to remove a portion of the first conductive layer 206 and the tunnel insulating layer 204. Next, the patterned photoresist is removed to form a patterned first conductive layer 206a, a patterned tunnel insulating layer 204a, and a portion of the substrate 200 is exposed from the trench 202.

Figure 4:
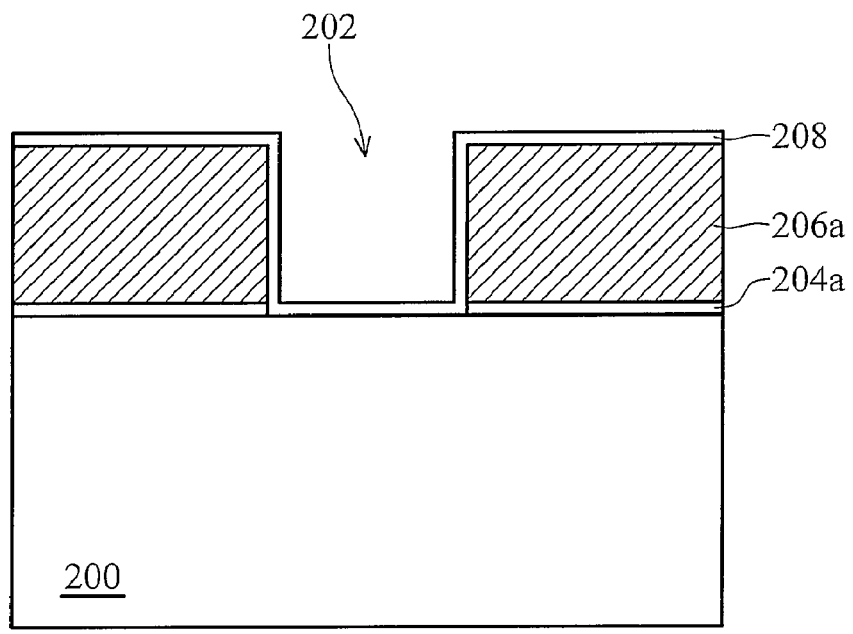

Referring to FIG. 4, a first insulating layer 208 is conformably formed in the trench 202 and on a surface of the first conductive layer 206a. The first insulating layer 208 may be a silicon dioxide ($SiO_2$) layer formed by thermal oxidation, atmospheric pressure chemical vapor deposition (APCVD) or low pressure CVD (LPCVD). Alternatively, the first insulating layer 208 may be a tantalum oxide ($Ta_2O_5$) formed by sputtering. The first insulating layer 208 may have a thickness of about 10 Å to 50 Å.

Figure 5:
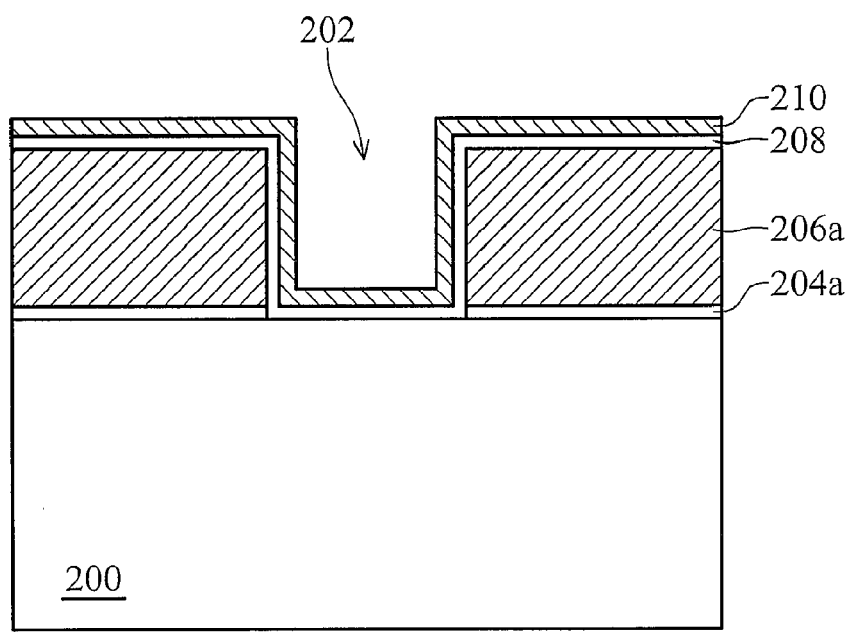

Next, referring to FIG. 5, a second insulating layer 210 is conformably formed covering the first insulating layer 208. In one embodiment, the second insulating layer 210 may be a silicon nitride ($Si_3N_4$) layer formed by chemical vapor deposition (CVD) with a thickness of about 20 Å to 100 Å.

Figure 6:
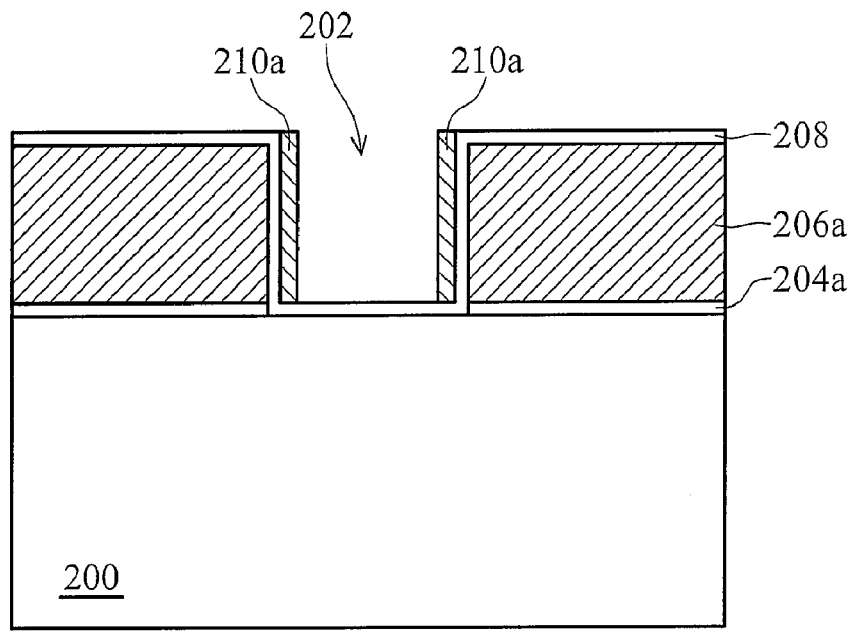

Next, referring to FIG. 6, the second insulating layer 210 formed on a top portion of the first conductive layer 206a and a bottom portion of the trench 202 is removed using anisotropic etching, for example, dry etching, to form a second insulating layer 210a on the sidewalls of the trench 202, and the first insulating layer 208 on the bottom of the trench 202 is exposed. In one embodiment, the second insulating layer 210 may have an etching selectivity of about 5 to 100 with the first insulating layer 208, preferably of about 10 to 100.

Figure 7:
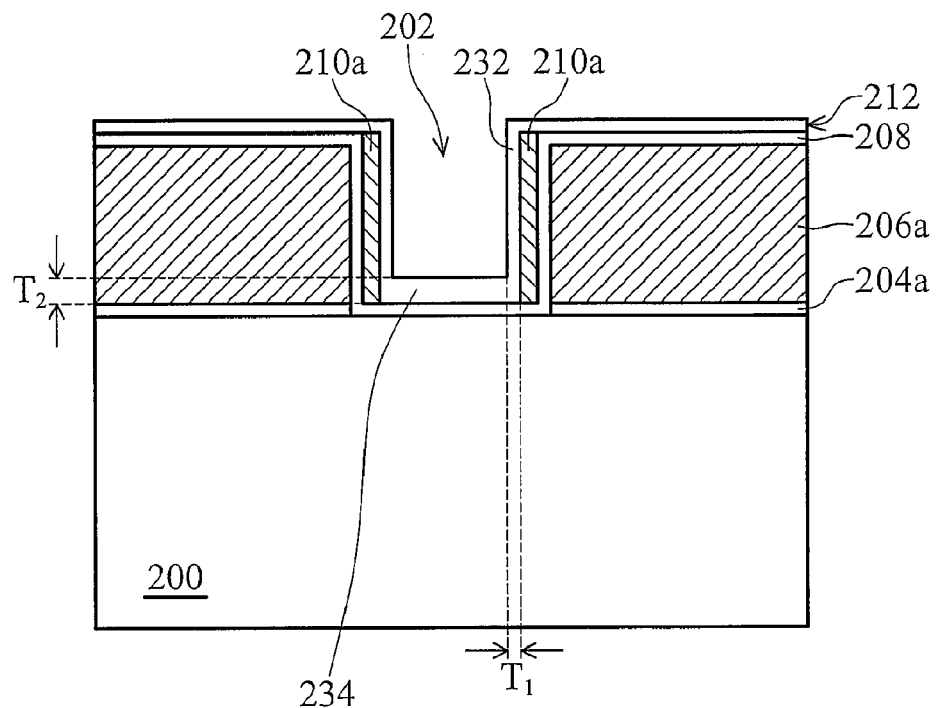

Referring to FIG. 7, a third insulating layer 212 is conformably formed in the trench 202, comprising a first portion 232 and a second portion 234. The first portion 232 of the third insulating layer 212 covers the second insulating layer 210a on the sidewalls of the trench 202. The second portion 234 of the third insulating layer 212 covers the first insulating layer 208 on the bottom of the trench 202. In one embodiment, the third insulating layer 212 may be a silicon dioxide ($SiO_2$) layer formed by high density plasma chemical vapor deposition (HDP CVD). HDP CVD method may comprise of three process steps such as a deposition process, an etching back process and another deposition process, wherein a thin film deposition rate on the sidewalls of the trench is slower than that of on the bottom of the trench. Therefore, HDP CVD method can be used to fill trenches with smaller dimensions. Plasma sources for HDP CVD method may comprise inductively-coupled plasma (ICP) or electron cyclotron resonance (ECR) sources. During the HDP CVD process, a thin film deposition rate of the first portion 232 of the third insulating layer 212 is slower than that of the second portion 234 of the third insulating layer 212. Therefore, a thickness $T_1$ of the first portion 232 of the third insulating layer 212 is thinner than a thickness $T_2$ of the second portion 234 of the third insulating layer 212. In one embodiment, the thickness $T_2$ is preferably three times thicker than the thickness $T_1$. Compared with an insulating layer formed by thermal oxidation, the thicknesses $T_1$ and $T_2$ of the third insulating layer 212 are more uniform, respectively. In one embodiment, the thickness $T_1$ may be between 20 Å to 70 Å, and the thickness $T_2$ may be between 50 Å to 200 Å. A difference in thickness between the thickness $T_1$ and the thickness $T_2$ of the third insulating layer 212 may be between 50 Å to 180 Å.

Figure 8:
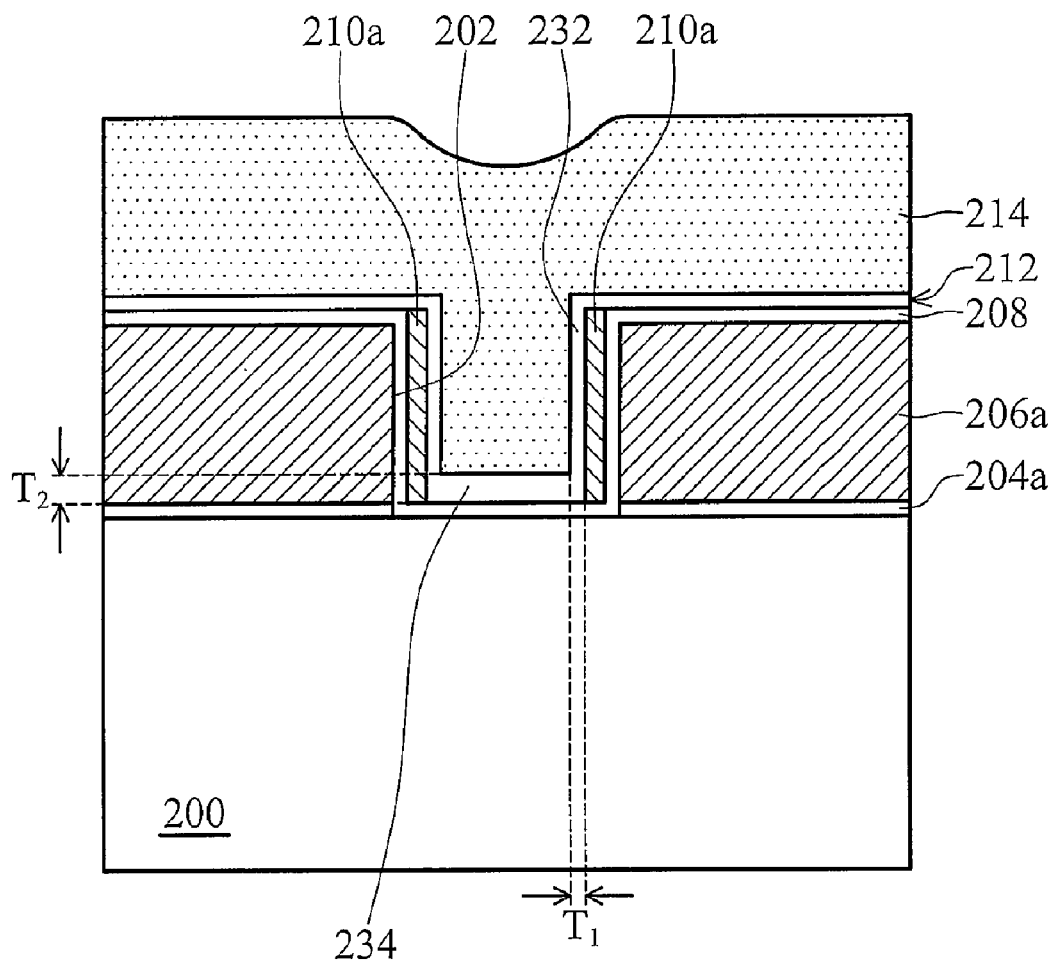

Next, referring to FIG. 8, a second conductive layer 214, filling the trench 202, is formed on the third insulating layer 212. The second conductive layer 214 may be a polysilicon (poly-Si) layer formed by CVD with a thickness of about 1000 Å to 3000 Å.

Figure 9:
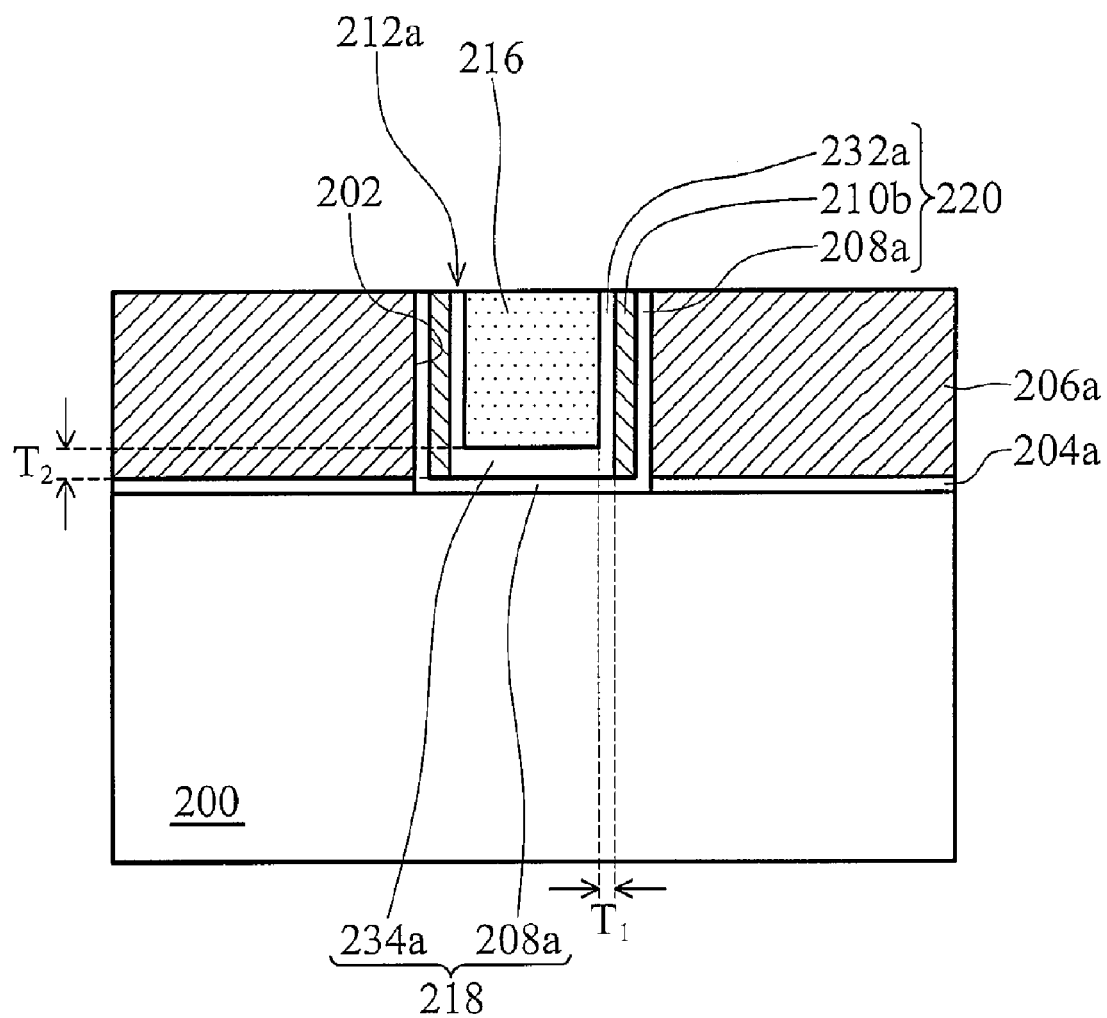

FIG. 9 illustrates formations of a control gate 216, a control gate insulating layer 218 and an inter-gate insulating layer 220. The control gate 216, the control gate insulating layer 218 and the inter-gate insulating layer 220 are formed at the same time by removing a portion of the second conductive layer 214, the third insulating layer 212, the second insulating layer 210a and the first insulating layer 208 using a planarization process, until the first conductive layer 206a is exposed. In one embodiment, the control gate 216 is disposed on the third insulating layer 212a in the trench 202. The planarized third insulating layer 212a comprises a first portion on the sidewalls of the trench 202, and a second portion 234a on the bottom of the trench 202. The control gate insulating layer 218 comprises the second portion 234a of the third insulating layer 212a and the first insulating layer 208a. The second portion 234a of the third insulating layer 212a and the first insulating layer 208a serve as an oxide laminate structure. Thickness of the control gate insulating layer 218 is mainly defined by the thickness $T_2$ of the third insulating layer 212. The inter-gate insulating layer 220 comprises the first portion 232a of the third insulating layer 212a, the second insulating layer 210b and the first insulating layer 208a. The first portion 232a of the third insulating layer 212a, the second insulating layer 210b and the first insulating layer 208a serve as an oxide/nitride/oxide (ONO) laminate structure. In one embodiment, the control gate 216 may be formed by a planarization process comprising etching back, chemical mechanical polishing or the like. The control gate 216 is substantially coplanar with the first conductive layer 206a.

Figure 10:
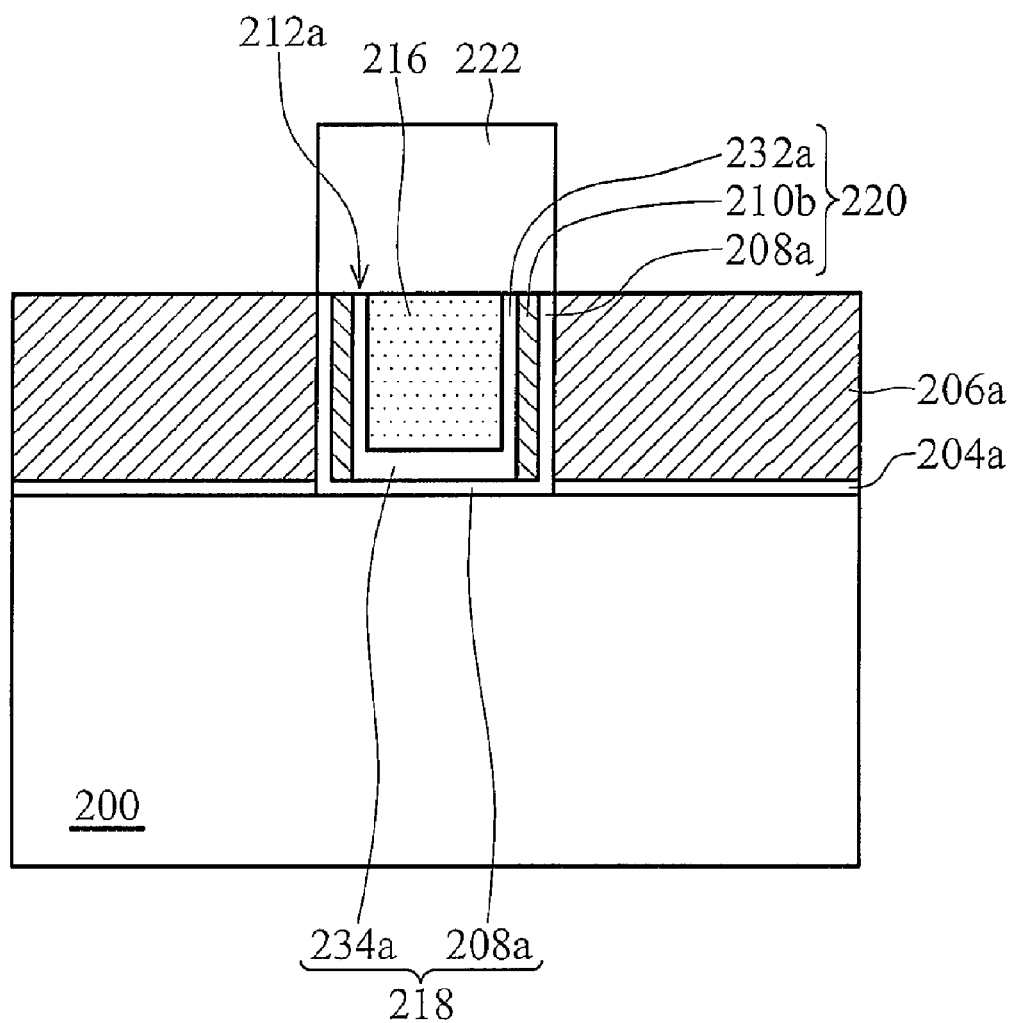

Referring to FIG. 10, a protective layer 222 is formed over the control gate 216, covering the inter-gate insulating layer 220. In one embodiment, the protective layer 222 may be formed by forming a nitride layer, such as, a silicon nitride ($Si_3N_4$) layer, using a deposition method, such as, chemical vapor deposition (CVD), with subsequence photolithography and etching processes.

Figure 11:
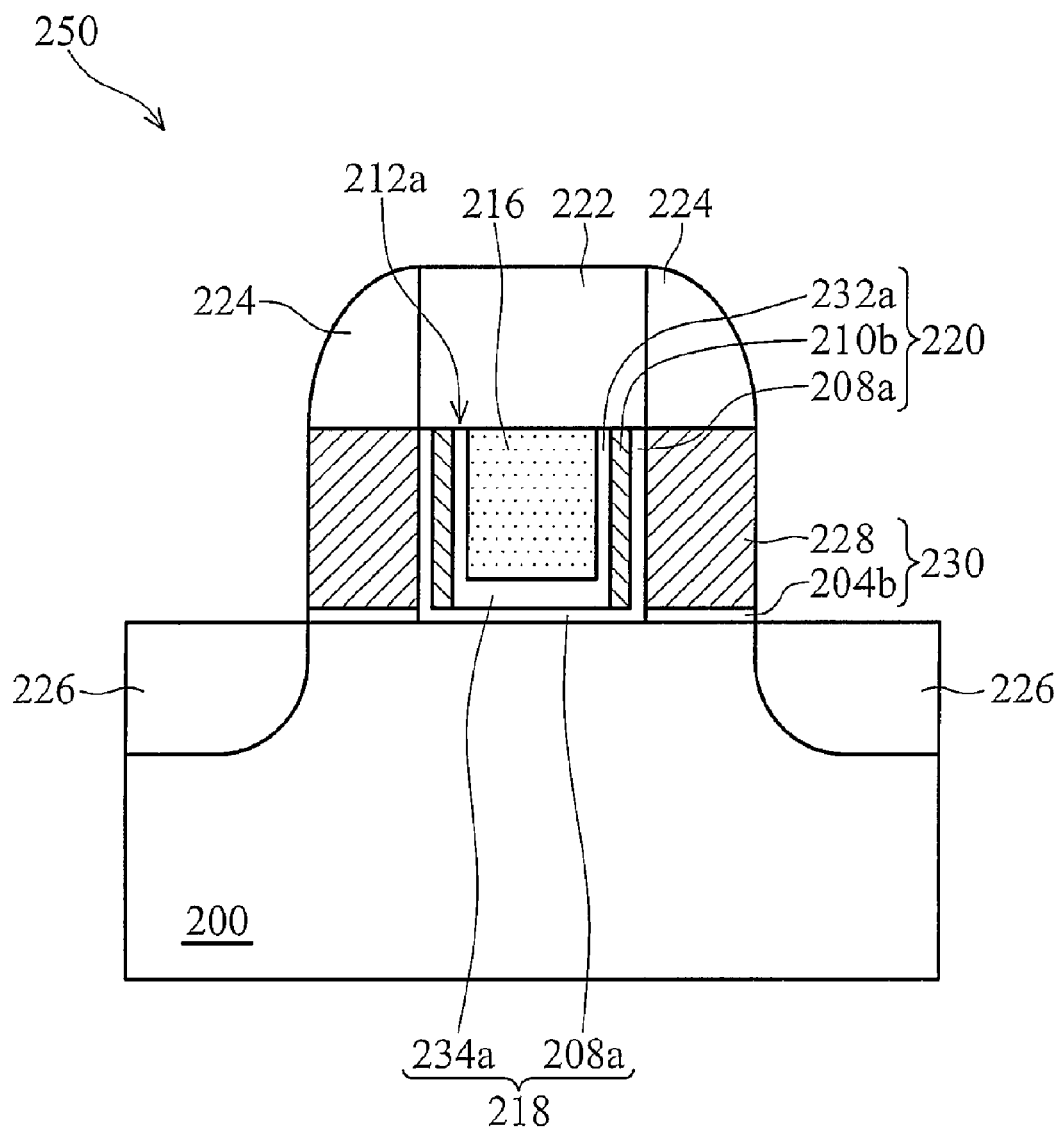

Next, referring to FIG. 11, a pair of spacers 224 is formed on the sidewalls of the protective layer 222. The spacers 224 may be formed of silicon dioxide ($SiO_2$) using tetraethoxysilane (TEOS) as a reactive gas. In one embodiment, an oxide layer, for example, a silicon dioxide ($SiO_2$) layer, may be deposited over the entire region by CVD. Next, an anisotropic etching process such as a dry etching process is performed to remove the oxide layer formed on a top portion of the protective layer 222 and the first conductive layer 206a as shown in FIG. 10. The spacers 224 are thus formed on the sidewalls of the protective layer 222, wherein width of a subsequence floating gate structures 230 are defined by a thickness of the spacers 224.

Next, a portion of the first conductive layer 206a and the tunnel insulating layer 204a as shown in FIG. 10 are etched to form a pair of self-aligned floating gate structures 230 using the protective layer 222 and the spacers 224 as masks. The self-aligned floating gate structure 230 comprises the floating gate 228 and the tunnel insulating layer 204b. After the etching process, sidewalls of the floating gate structures 230 are self-aligned to the spacers 224, thus, the photolithography process for forming floating gate structures 230 can be eliminated. Next, an ion implantation process may be performed to form source/drain regions 226 in the substrate 200 using the protective layer 222 and the spacers 224 as masks. Therefore, an exemplary embodiment of a nonvolatile memory device 250 of the invention is completed.

An exemplary embodiment of a nonvolatile memory device 250 of the invention comprises a common-used control gate 216 and a pair of the floating gate structures 230. The third insulating layer 212 is formed by HDP CVD, wherein a thin film deposition rate of a first portion 232 of the third insulating layer 212 is slower than that of a second portion 234 of the third insulating layer 212. And the first portion 232 and the second portion 234 of the third insulating layer 212 have uniform thicknesses, respectively. In an exemplary embodiment of a nonvolatile memory device 250 of the invention, thickness of the control gate insulating layer 218 is mainly defined by the second portion 234 of the third insulating layer 212. Compared with the conventional control gate insulating layer formed by thermal oxidation, the control gate insulating layer 218 is more uniform to improve electrical performances of a nonvolatile memory device. Thus, avoiding malfunctions due to non-uniform control gate insulating layer thickness.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A nonvolatile memory device, comprising:
    a substrate;
    a pair of floating gate structures, comprising a tunnel insulating layer and a floating gate disposed on the substrate and facing each other, wherein the pair of the floating gate structures are isolated from each other by a trench;
    a first insulating layer conformably disposed on sidewalls of the trench and the substrate in the trench;
    a second insulating layer, conformably disposed on the first insulating layer on the sidewalls of the trench;
    a third insulating layer, comprising a first portion disposed on the second insulating layer on the sidewalls of the trench, and a second portion disposed on the first insulating layer on the substrate, wherein the first portion has a thickness thinner than that of the second portion; and
    a control gate, disposed on the third insulating layer in the trench.

2. The nonvolatile memory device as claimed in claim 1, further comprising:
    a protecting layer over the control gate; and
    a pair of spacers on the sidewalls of the protecting layer, covering a top portion of the floating gate structures.

3. The nonvolatile memory device as claimed in claim 2, wherein the third insulating layer comprises an oxide layer formed by high density plasma chemical vapor deposition.

4. The nonvolatile memory device as claimed in claim 3, wherein a difference in thickness between the first portion and the second portion of the third insulating layer is between 50 Å to 180 Å.

5. The nonvolatile memory device as claimed in claim 1, wherein the thicknesses of first portion and the second portion of the third insulating layer have uniform thicknesses, respectively.

6. The nonvolatile memory device as claimed in claim 1, wherein the control gate is substantially coplanar with the floating gate.

* * * * *